(12) United States Patent
Adamian

(10) Patent No.: US 7,157,918 B2
(45) Date of Patent: Jan. 2, 2007

(54) METHOD AND SYSTEM FOR CALIBRATING A MEASUREMENT DEVICE PATH AND FOR MEASURING A DEVICE UNDER TEST IN THE CALIBRATED MEASUREMENT DEVICE PATH

(75) Inventor: Vahe' A. Adamian, Lexington, MA (US)

(73) Assignee: Agilent Technologies, Inc., Santa Clara, CA (US)

( * ) Notice: Subject to any disclaimer, the term of this patent is extended or adjusted under 35 U.S.C. 154(b) by 68 days.

(21) Appl. No.: 11/391,737

(22) Filed: May 23, 2005

(65) Prior Publication Data

US 2006/0181286 A1 Aug. 17, 2006

Related U.S. Application Data

(62) Division of application No. 10/244,638, filed on Sep. 16, 2002, now Pat. No. 7,019,535.

(51) Int. Cl.
*G01R 35/00* (2006.01)
*G01R 27/04* (2006.01)

(52) U.S. Cl. ...................... 324/601; 324/650

(58) Field of Classification Search ............... 324/601, 324/650
See application file for complete search history.

(56) References Cited

U.S. PATENT DOCUMENTS 5,578,932 A * 11/1996 Adamian .................... 324/601

* cited by examiner

Primary Examiner—Vincent Q. Nguyen

(57) ABSTRACT

A method and system of calibrating first and second adapters comprises the steps of calibrating coaxial ports of a vector network analyzer to traceable standards and connecting a symmetrical through circuit path between the coaxial ports. The through circuit path comprises a cascaded combination of the first and second adapters. The first adapter is passive and substantially identical to the second adapter and uncascaded first and second adapters comprise a measurement device path. The through circuit path and the measurement device path have substantially equivalent S-parameters. S-parameters of the through circuit path are measured and then the first and second adapters are characterized based upon the measured S-parameters. The method and system may be applied to two port adapters and devices under test and may also be scaled for multi-port adapters and devices under test.

11 Claims, 13 Drawing Sheets

METHOD AND SYSTEM FOR CALIBRATING A MEASUREMENT DEVICE PATH AND FOR MEASURING A DEVICE UNDER TEST IN THE CALIBRATED MEASUREMENT DEVICE PATH

This application is a Divisional Application of Application Ser. No. 10/244,638 filed Sep. 16, 2002, now U.S. Pat. No. 7,019,535.

BACKGROUND

It is known that errors exist in a measurement made by a Vector Network Analyzer (VNA). These measurement errors contribute to the uncertainty of the result given by the measurement of a device under test ("DUT"). The measurement errors may be categorized into two types, random errors and systematic errors. Random errors are non-repeatable variations of the same measurement due to physical and environmental changes over time. Systematic errors are repeatable variations in the measurement as a result of the VNA test set. Typically, the systematic errors represent the larger contribution to measurement uncertainty. It is possible to mathematically reduce the systematic errors in a VNA measurement through calibration. Calibration comprises connecting a number of well-known standards to the VNA and measuring the response for each of the well-known standards. The systematic errors are quantified by calculating the difference between the measured response and the expected response for each of the well-known standards. This difference is used to develop an error correction model that may be used to mathematically remove systematic errors from a VNA measurement of the DUT. The calibration process effectively establishes a measurement reference plane at the point where the calibration standards are connected to the VNA measurement ports. Accordingly, it is possible to obtain a measurement of just the DUT by connecting the DUT to the measurement reference plane.

There are a number of calibration methods including a short-open-load-through (SOLT) calibration, a through-reflect-line (TRL) calibration, and an electronic calibration. A method and apparatus for an electronic calibration is disclosed in U.S. Pat. No. 5,434,511 entitled "Electronic Microwave Calibration Device" which issued on Jul. 18, 1995, the contents of which are hereby incorporated by reference herein. The SOLT, TRL and electronic calibration methods typically use calibration standards that are traceable to standards kept by the National Institute of Standards Technology (NIST). As one of ordinary skill in the art can appreciate, the quality of the error correction is directly related to the quality of the known standards. Most traceable calibration standards are made with coaxial connectors. As a practical reality, however, many devices either in a production or research environment do not have a coaxial connection. As a result, a series of standards disposed on a printed circuit board (PCB) and connected to an appropriate connector have been developed for use with non-coaxial measurement devices.

With specific reference to FIG. 1 of the drawings, there is shown a fixture 10 on which is disposed non-coaxial calibration standards and a measurement device path 104. The "on-board" calibration standards shown are the SOLT set of calibration standards and comprise an open circuit 20, a short circuit 30, a 50 ohm or 75 ohm load 40, and a through circuit path 102. Calibration of the fixture shown in FIG. 1 of the drawings comprises performing the conventional SOLT calibration process using the on-board calibration standards. Disadvantageously, the on-board calibration standards cannot be traced to an NIST standard. Specifically, the on-board short circuit 30 typically has some inductance associated with it. The on-board open circuit 20 typically has some capacitance associated with it and the load 40 does not typically represent a pure resistive 50 ohm or 75 ohm termination. It is difficult to accurately model the parasitic inductive and capacitive reactances that are associated with the on-board short and open, respectively. Because the calibration process does not have an accurate model of the parasitics associated with the calibration standards, there are irresolvable errors resulting from the calibration and error correction process. Measurement errors adversely affect the reliability of conclusions drawn from the measurements made. Accordingly, there is a need for an improved method and system for calibrating and measuring the high frequency characteristics of non-coaxial devices.

SUMMARY

In one embodiment according to the teachings of the present invention, a method of calibrating first and second adapters comprises the steps of calibrating coaxial ports of a vector network analyzer to traceable standards and connecting a symmetrical through circuit path between the coaxial ports. The through circuit path comprises a cascaded combination of the first and second adapters. The first adapter is passive and substantially identical to the second adapter and uncascaded first and second adapters comprise a measurement device path. The through circuit path and the measurement device path have substantially equivalent S-parameters. The method further includes measuring S-parameters of the through circuit path and then characterizing the first and second adapters based upon the measured S-parameters.

In another embodiment according to the teachings of the present invention, a system for calibrating a measurement device path comprises a vector network analyzer (VNA), calibration standards, and a means for calibrating ports of the VNA with the calibration standards. A fixture comprises a symmetrical through circuit path and a measurement device path. The through circuit path comprises a cascaded combination of first and second adapters, the first adapter being passive and substantially identical to the second adapter. The measurement device path comprises uncascaded first and second adapters, wherein the through circuit path and the measurement device path have substantially equivalent S-parameters. The system further comprises means in the VNA for measuring frequency domain coefficients of the through circuit path and means for characterizing the first and second adapters based upon the S-parameters of the through circuit path.

Advantageously, a method and system according to the teachings of the present invention provides for an improved method of calibrating connections to non-coaxial devices under test for high frequency measurements to achieve improved accuracy with less time and effort than available under the prior art. Specifically, it is possible to achieve calibration accuracy on the same order of magnitude as is conventionally only available for devices having coaxial connectors.

DETAILED DESCRIPTION

Figure 1:
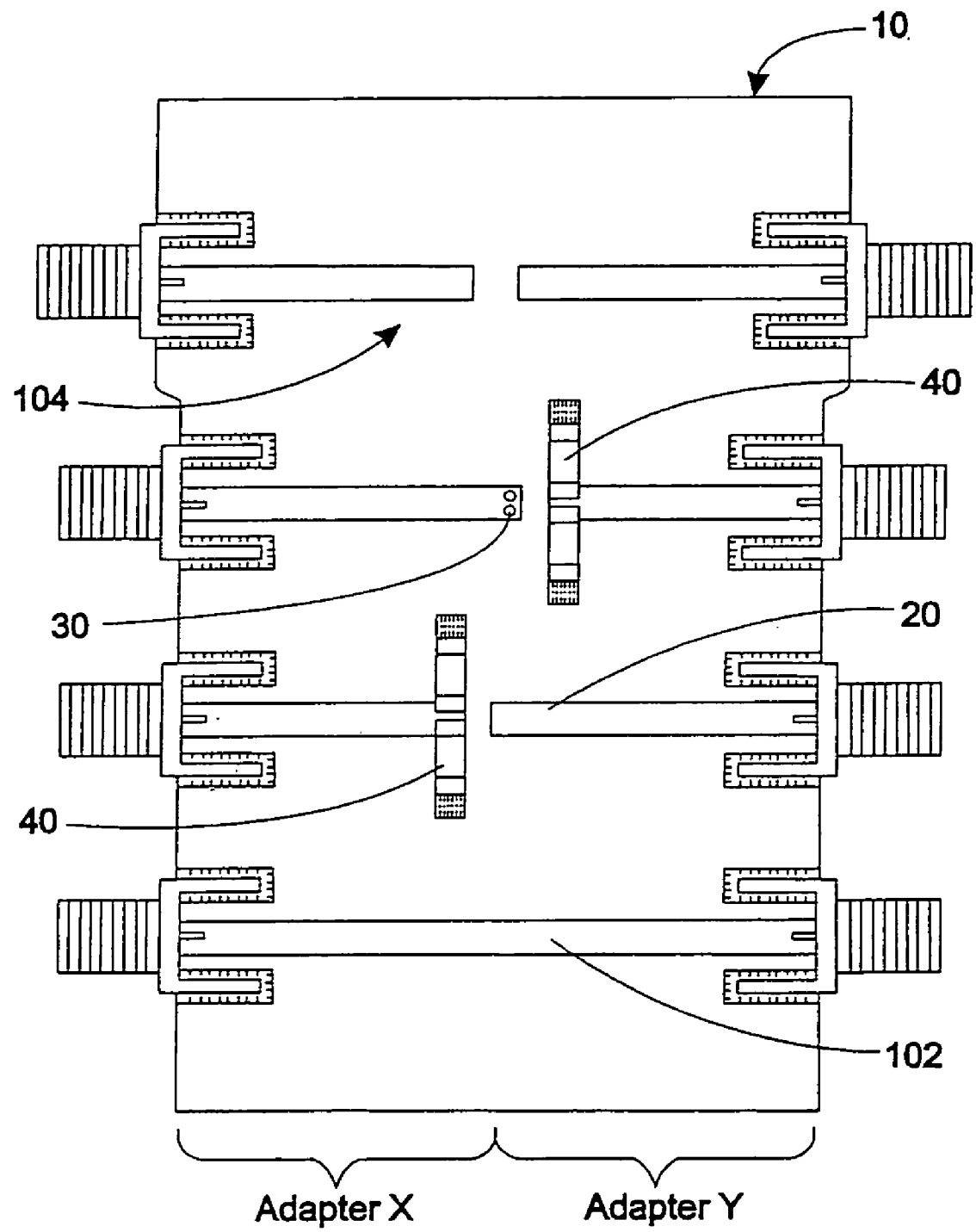
FIG. 1 is an illustration of on-board calibration standards used in a prior art calibration method.
Figure 2:
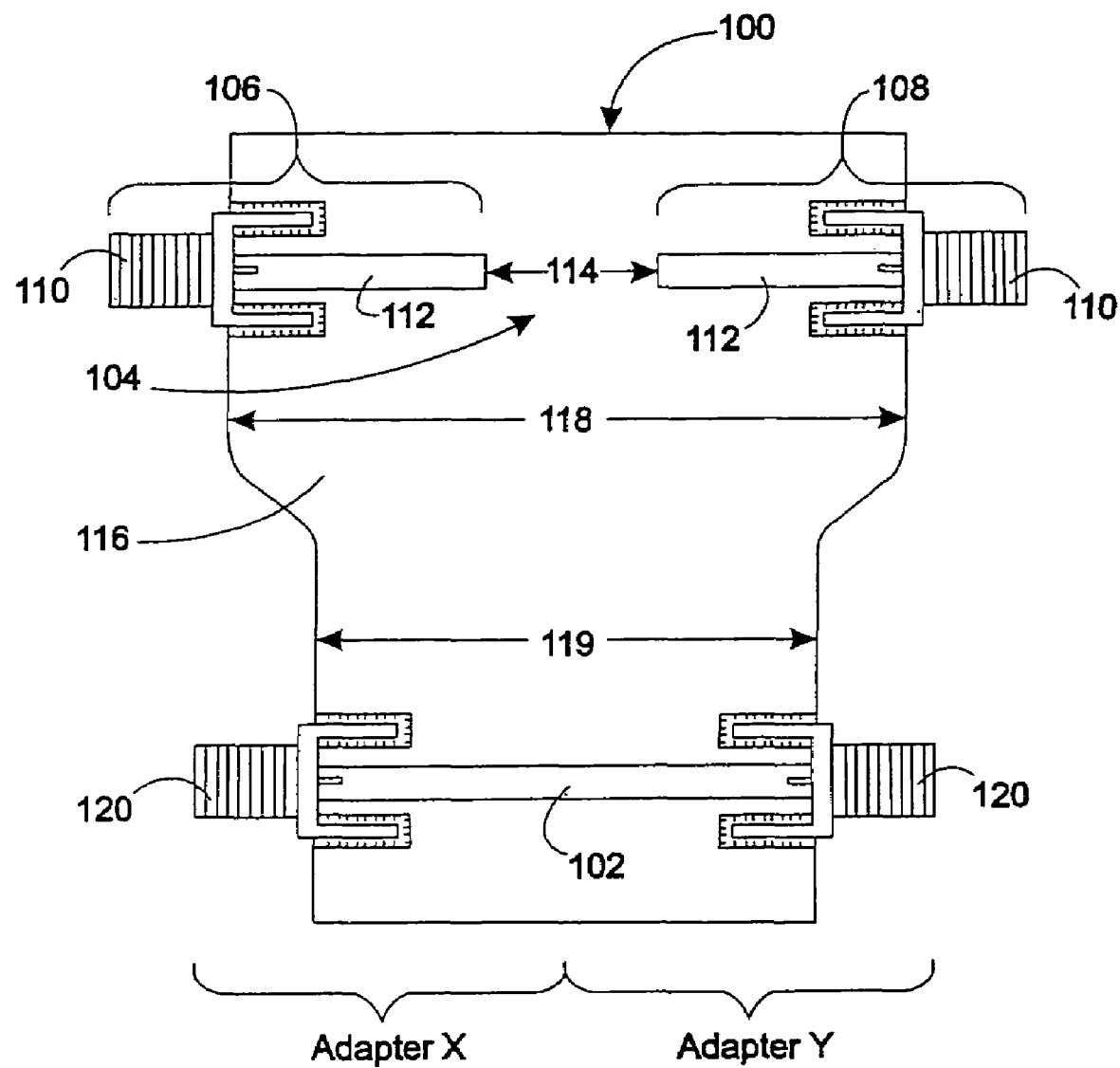
FIG. 2 is an illustration of a fixture for use with an embodiment of a method and system according to the teachings of the present invention.

With specific reference to FIG. 2 of the drawings, there is shown a fixture 100 for use in an embodiment of the present invention. The fixture comprises a symmetrical through circuit path 102 and a measurement device path 104. The measurement device path 104 comprises two substantially identical adapters, first adapter 106 and second adapter 108. The reference character X represents the first adapter 106 and the reference character Y represents the second adapter 108 in later portions of this disclosure. Each adapter 106, 108 is a passive circuit and comprises a coaxial connector 110 electrically connected to a conductor strip 112. Each adapter 106, 108 of the measurement device path 104 is positioned in the fixture in mirror image to the opposite adapter with a gap 114 between ends of the conductor strips 112 that are not connected to the coaxial connectors 110. Each terminal of a two-terminal device under test (DUT) makes contact with respective conductor strips 112 to complete a measurement circuit between the first and second adapters 106, 108. The through circuit path 102 comprises an uninterrupted conductor strip between two coaxial connectors 120. The coaxial connectors 120 of the through circuit path 102 have substantially similar geometry as each other and the coaxial connectors of the measurement device path 104.

The through circuit path 102 and the measurement device path 104 are disposed on a printed circuit board substrate 116. The printed circuit board substrate 116 is made of FR4, a type of fiberglass/epoxy resin commonly used in printed circuit board manufacturing. An alternative material for the printed circuit board substrate 116 is Duroid, which may be used for higher frequency applications. The conductor strip that is part of the first and second adapters 106, 108 as well as the conductor strip that is part of the through circuit path 102 is typically copper although other low loss, conductive materials are acceptable as well. It is acceptable to use other substrate materials to produce the printed circuit board, however, best results are obtained when a reasonably consistent dielectric constant is maintained over the entire printed circuit board substrate 116. In a preferred embodiment, the copper conductive strips are etched onto the printed circuit board using conventional processes to create the through circuit path 102 as well as the measurement device path 104. Current technology produces very repeatable and consistent geometries including the width and thickness of the conductor strips 112 as well as the dimensions of the printed circuit board substrate 116. Conventional high quality etching processes are sufficiently repeatable to achieve high quality results. It is also beneficial to use a high quality coaxial to microstrip transition to minimize ground current paths in the fixture 100. A first width 118 of the printed circuit board substrate 116 is at the measurement device path 104 and is larger than a second width 119 of the printed circuit board substrate 116 at the through circuit path 102. The difference between the first width 118 and the second width 119 is equal to the distance between the first adapter 106 and the second adapter 108. As one of ordinary skill in the art can appreciate, the cascaded combination of the first and second adapters 106, 108 has the same physical properties as the through circuit path 102. Accordingly, the scattering parameters (S-parameters) of the through circuit path 102 are substantially equivalent to the S-parameters of the cascaded combination of the first and second adapters 106, 108. As one of ordinary skill in the art can also appreciate, the S-parameters of the first adapter 106 are substantially equivalent to the S-parameters of the second adapter 108.

Figure 3:
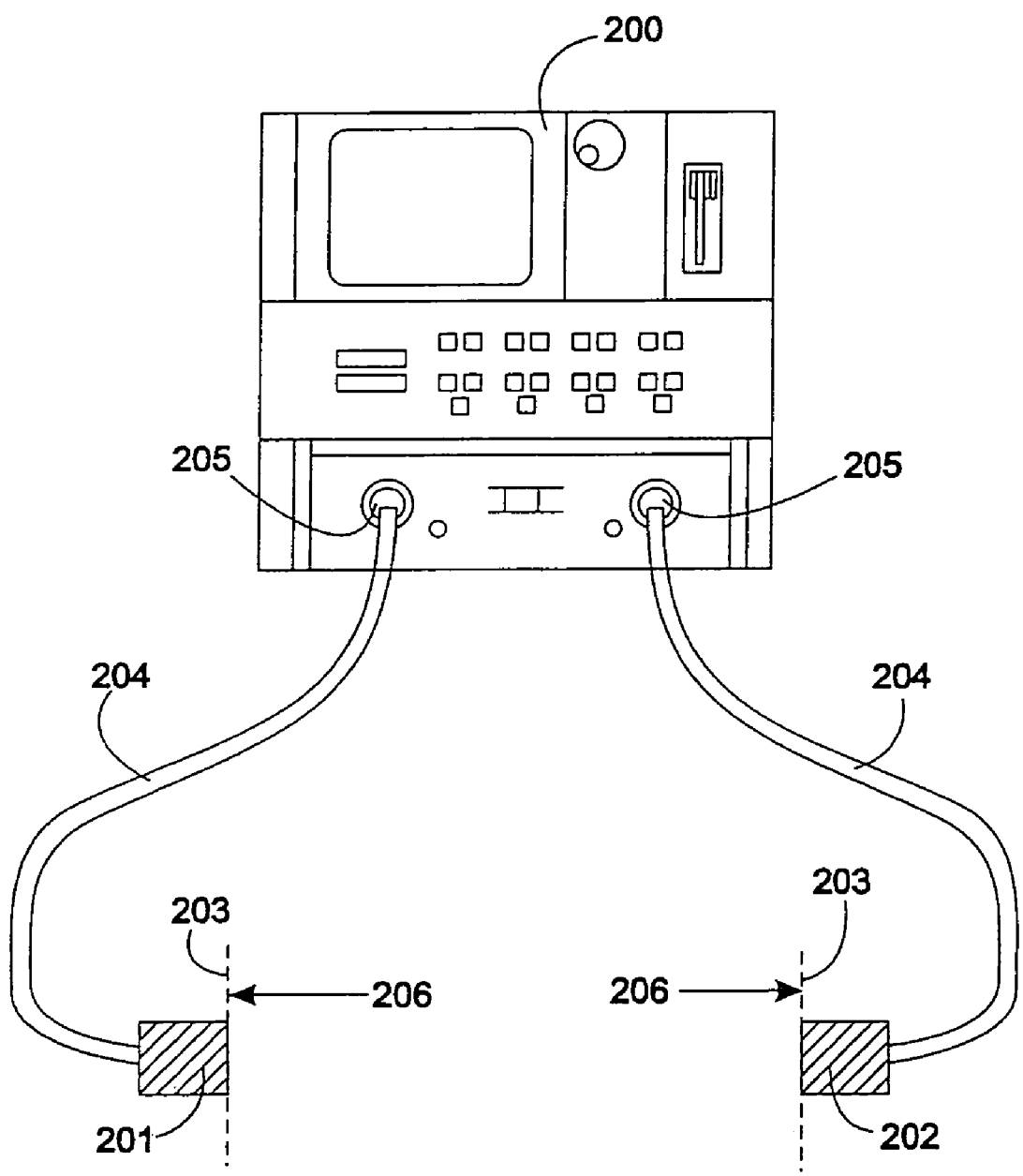
FIGS. 3 and 4 are illustrations of appropriate interconnections to perform a calibration according to the teachings of the present invention.

With specific reference to FIG. 3 of the drawings, a fixture 100 is calibrated by first performing a conventional calibration with the VNA 200 in combination with coaxial cables 204 having coaxial ports 201, 202 at a measurement end 206 of the cables 204. This calibration may be performed in any one of the conventional ways using calibration standards traceable to NIST. This calibration step provides for a traceable calibration to a reference plane 203 at which the fixture 100 is connected to the VNA 200.

Figure 4:
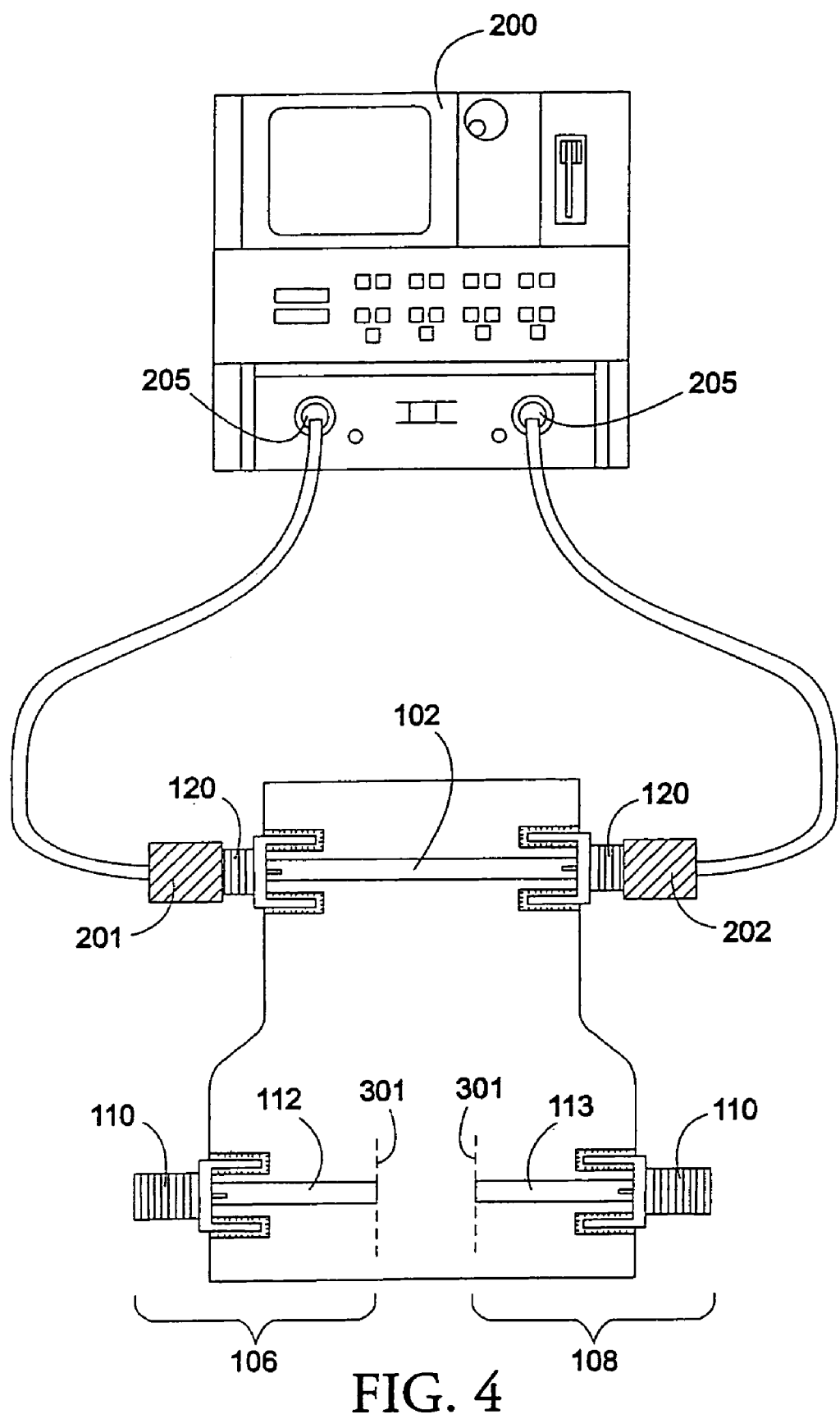

With specific reference to FIG. 4 of the drawings, the coaxial ports 201, 202 at the reference plane 203 are then connected to the coaxial ports 120 of the symmetrical through circuit path 102. The VNA 200 makes a measurement of the S-parameters of the through circuit path 102. Because the through circuit path 102 is substantially similar to the cascaded combination of the first and second adapters 106, 108, the first and second adapters 106, 108 may be characterized based upon the measured S-parameters of the through circuit path 102. The characterization of the first and second adapters 106, 108 permits calibration to a DUT reference plane 301 disposed at the ends of the conductor strips 112 that comprise the first and second adapters 106, 108. The result of the characterization step is a complete S-parameter matrix for each of the first and second adapters 106, 108.

Figure 5:
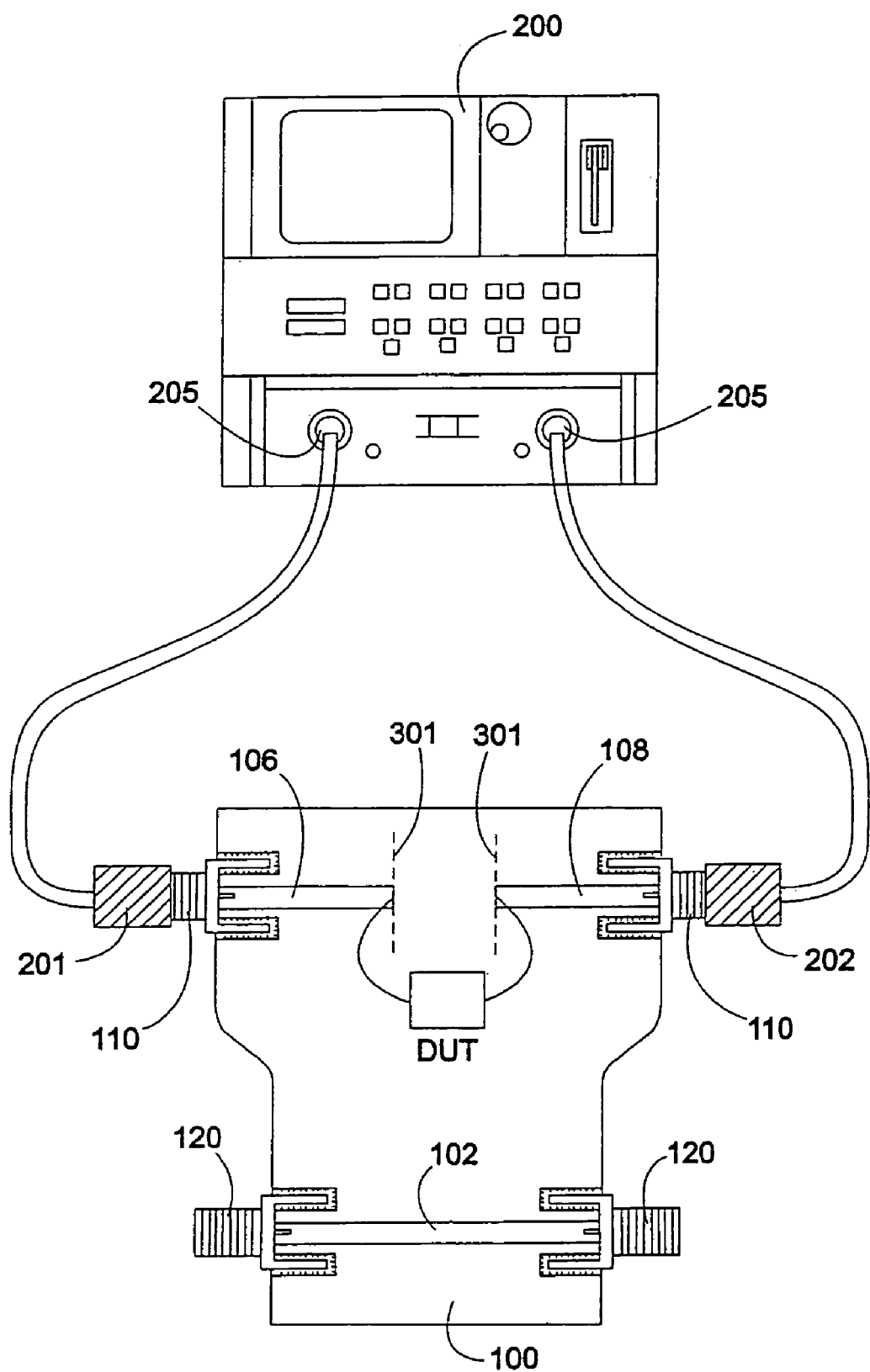
FIG. 5 is an illustration of appropriate interconnections to perform a measurement of a non-coaxial device under test (DUT).

With specific reference to FIG. 5 of the drawings, a user then connects the DUT to the DUT reference plane 301. The VNA 200 measures the DUT in cascaded combination with the first and second adapters 106, 108. Because the first and second adapters 106, 108 are fully characterized, it is possible to de-embed the contribution made by the first and second adapters 106, 108 to a measurement of a device under test (DUT) made in cascaded combination with the first and second adapters 106, 108 to yield only the S-parameters of the DUT. The appropriate process for de-embedding is found in the teachings of U.S. patent application Ser. No. 10/098,040 entitled "Method, Apparatus, and Article of Manufacture for Characterizing a Device and Predicting Electrical Behavior of the Device in a Circuit", the contents of which are incorporated by reference herein.

Figure 6:
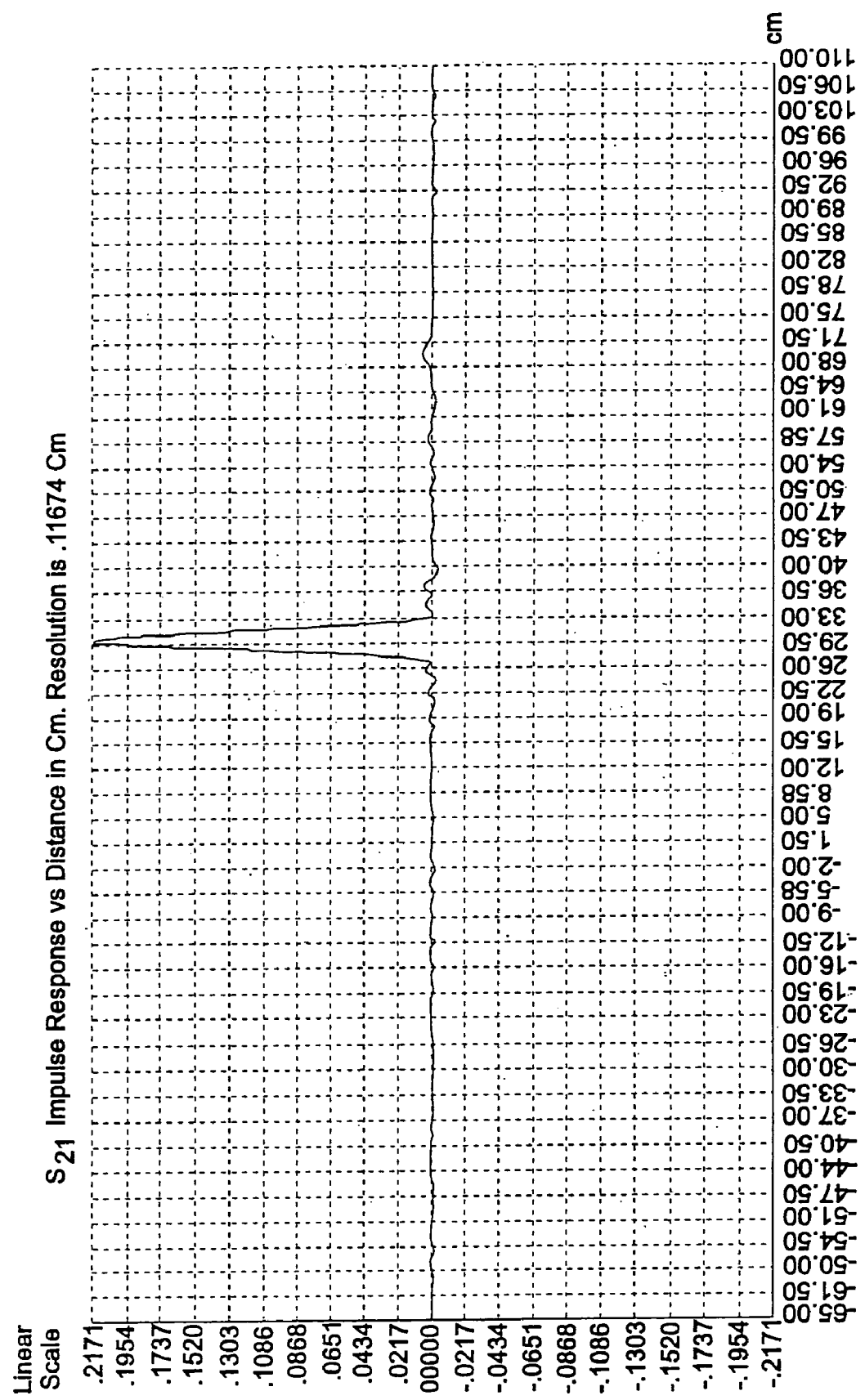
FIG. 6 is a graph showing an illustrative time domain impulse transmission response of the through standard.
Figure 7:
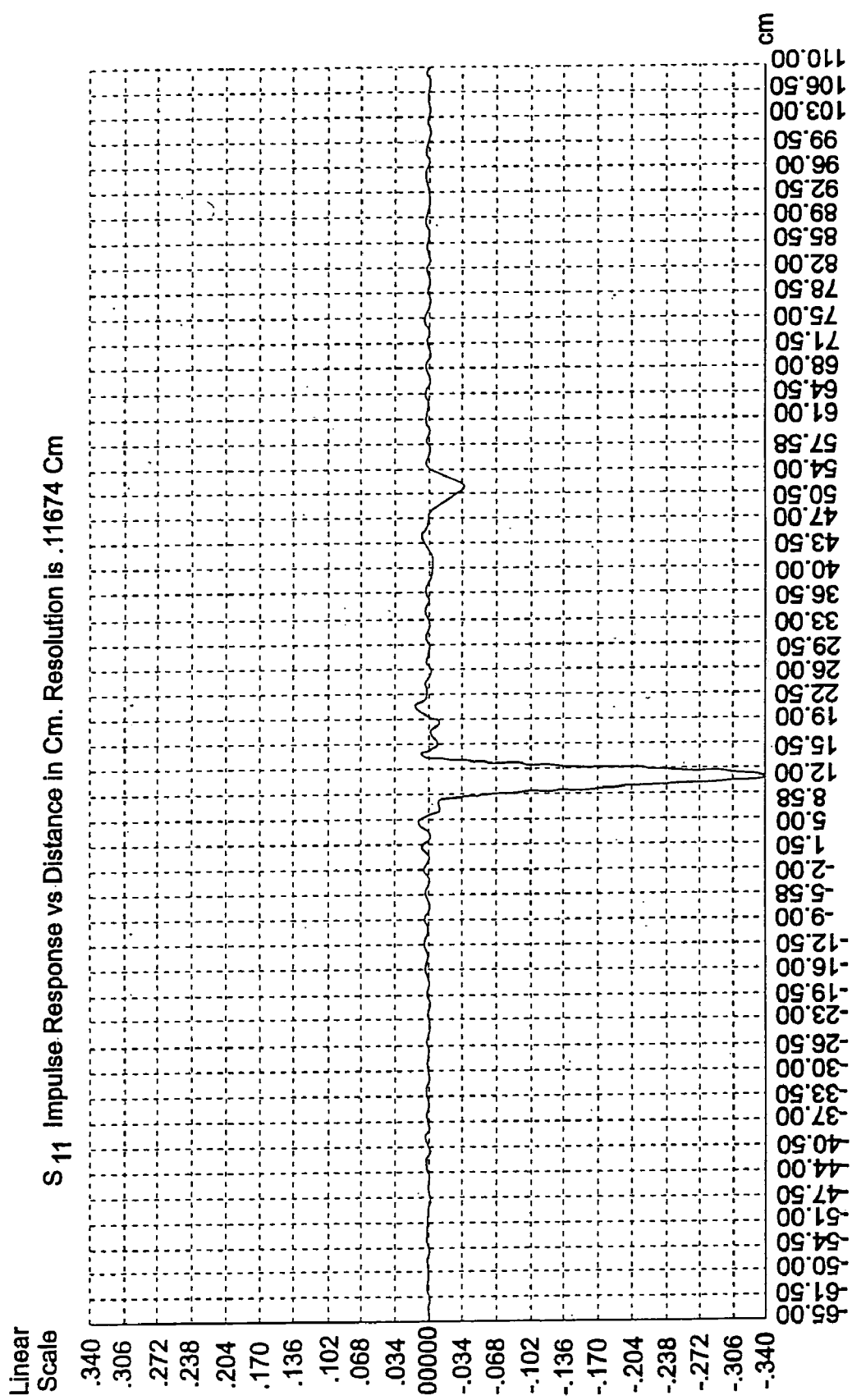
FIG. 7 is a graph showing an illustrative time domain impulse reflection response of the through standard.
Figure 8:
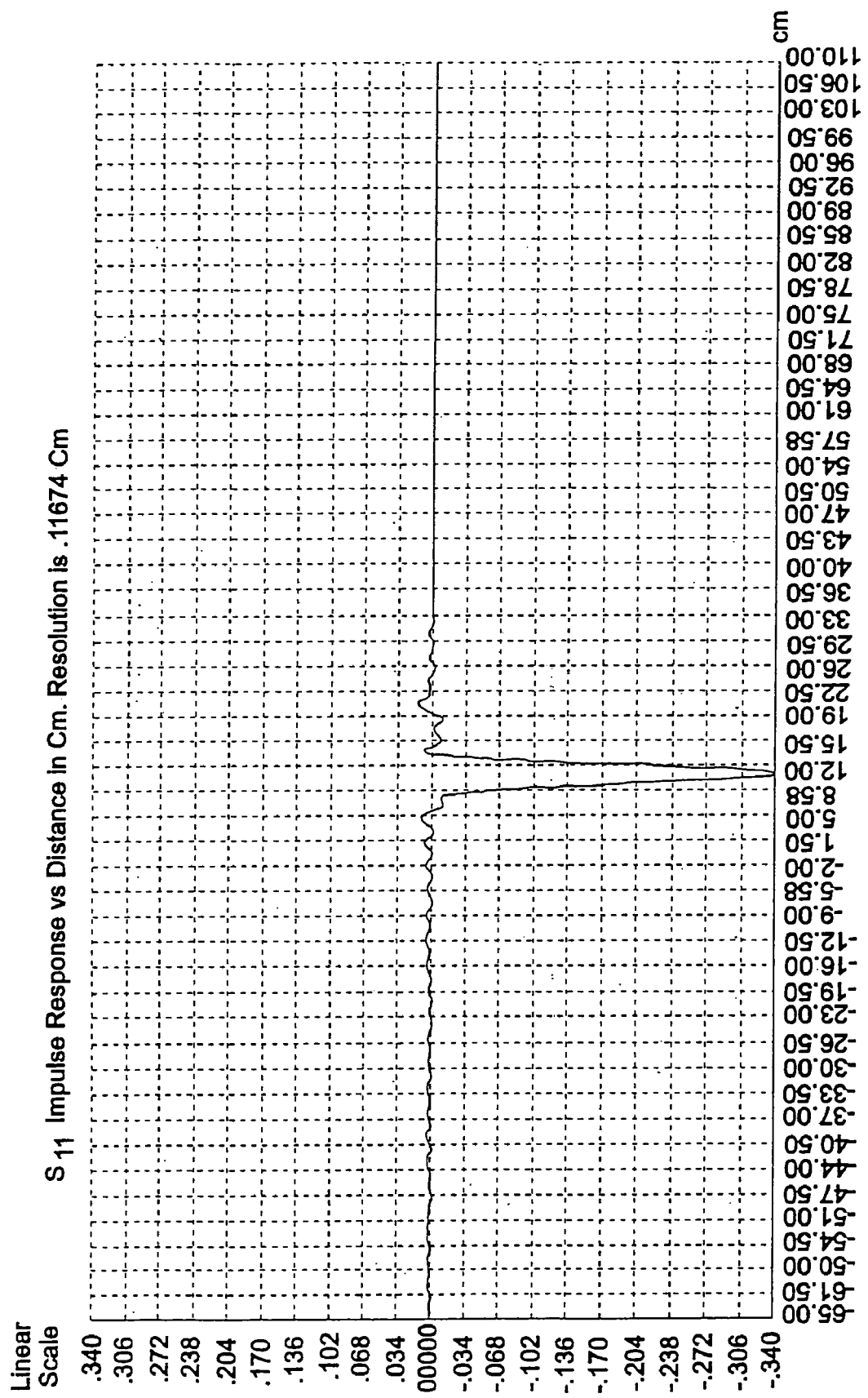
FIG. 8 is a graph showing the time domain impulse reflection response of the through standard as modified according to the teachings of the present invention.

The characterization process comprises first measuring the S-parameters of the through circuit path 102. The result of the S-parameter measurement provides a frequency domain reflection coefficient ($S_{thru11}$) and a frequency domain transmission coefficient ($S_{thru21}$) of the through circuit path 102. Because the through circuit path 102 is symmetrical and passive, then $S_{thru11}=S_{thru22}$ and $S_{thru21}=S_{thur12}$. The frequency domain transmission coefficient ($S_{thru21}$) of the through circuit path 102 is then converted to a corresponding time domain impulse transmission response using the transformation algorithm disclosed in "The Chirp z-transform Algorithm" by L. W. Rabiner, R. Schafer, and C. M. Rader published in IEEE Transactions on Audio and Electroaacoustics, Vol. AU-17, No. 2, June 1969, pp. 86–92. With specific reference to FIG. 6 of the drawings, there is shown an illustration of a time domain impulse transmission response for a through circuit path 102 as converted from the frequency domain measurement. The results of the conversion of the frequency domain transmission coefficient of the through circuit path 102 ($S_{thru21}$) to the corresponding time domain impulse transmission response of the through circuit path 102 provide a value for a total electrical length of the through circuit path 102. In the specific example of FIG. 6, the electrical length is shown to be 29.85 cm in air dielectric. Because the first and second adapters 106, 108 are symmetrical, this electrical length represents twice the electrical length of both first and second adapters 106, 108. With specific reference to FIG. 7 of the drawings, the characterization process then converts the frequency domain reflection coefficient ($S_{thru11}$) to a corresponding time domain impulse reflection response for the through circuit path 102. Because it is a reflection measurement, the time domain impulse reflection response naturally contains a factor of two with respect to electrical length. With specific reference to FIG. 8 of the drawings, the time domain impulse reflection response is then modified by limiting the time sweep to the electrical length of the through circuit path 102 measured using the time domain impulse transmission response. The remaining length of the time domain impulse reflection response is then set to zero. FIG. 8 of the drawings illustrates a time domain impulse reflection response for the through circuit path 102 as modified. The modified time domain impulse reflection response represents a time domain impulse reflection response for only the first adapter 106 terminated in a perfect load. The time domain impulse reflection response as modified to represent a limited time sweep as shown in FIG. 8 of the drawings is then converted back to the frequency domain to yield a frequency domain reflection coefficient of just the first adapter 106 ($S_{X11}$). When the frequency domain reflection coefficient ($S_{X11}$) is known, it is possible to calculate the remaining S-parameters. Specifically:

$$S_{X22} = \frac{S_{thru11} - S_{X11}}{S_{thru12}} \text{ and} \quad (1)$$

$$S_{X21} = \sqrt{S_{thru12} - \frac{(S_{X11} - S_{thru11})^2}{S_{thru12}}} \quad (2)$$

Equation (2) has two possible solutions for $S_{X21}$. Only one of the solutions, however, is physically possible. It is possible to determine the correct solution using the teachings of U.S. Pat. No. 5,548,221 entitled "Electronic Calibration Method and Apparatus" issued Aug. 20, 1996, the teaching of which are hereby incorporated by reference herein. Because the first adapter 106 is passive, then $S_{X21}=S_{X12}$. Accordingly, all S-parameters of the first adapter 106 are known. Because the first adapter 106 is electrically and mechanically equivalent to the second adapter 108 and the second adapter 108 is positioned in the fixture in mirror image to the first adapter 106, then the S-parameter values have the following relationship:

$$\begin{bmatrix} S_{X11} & S_{X12} \\ S_{X21} & S_{X22} \end{bmatrix} = \begin{bmatrix} S_{Y22} & S_{Y21} \\ S_{Y12} & S_{Y11} \end{bmatrix} \quad (3)$$

Accordingly, all S-parameters for both the first and second adapters 106, 108 can be determined from a measurement of the through circuit path 102 and the characterization process taught herein.

The method according to the teachings of the present invention lends itself well to implementation with a computer. Conventional VNAs, such as the Agilent E8358A, include measurement electronics as well as a dedicated computer within a single electronic unit. The dedicated computer includes a processing element, operating system, media storage and read capabilities, and is capable of executing steps of a software program. Accordingly, a system for calibrating first and second adapters 106, 108 may be implemented wholly within the VNA 200 as shown in FIGS. 2 and 3 of the drawings or with a computer communicating with the VNA 200 (not shown in the drawings). In a system for calibrating first and second adapters 106, 108, the VNA 200 has cables 204 with coaxial ports connecting the cables 204 to both VNA ports 205 and the fixture 100.

Figure 9:
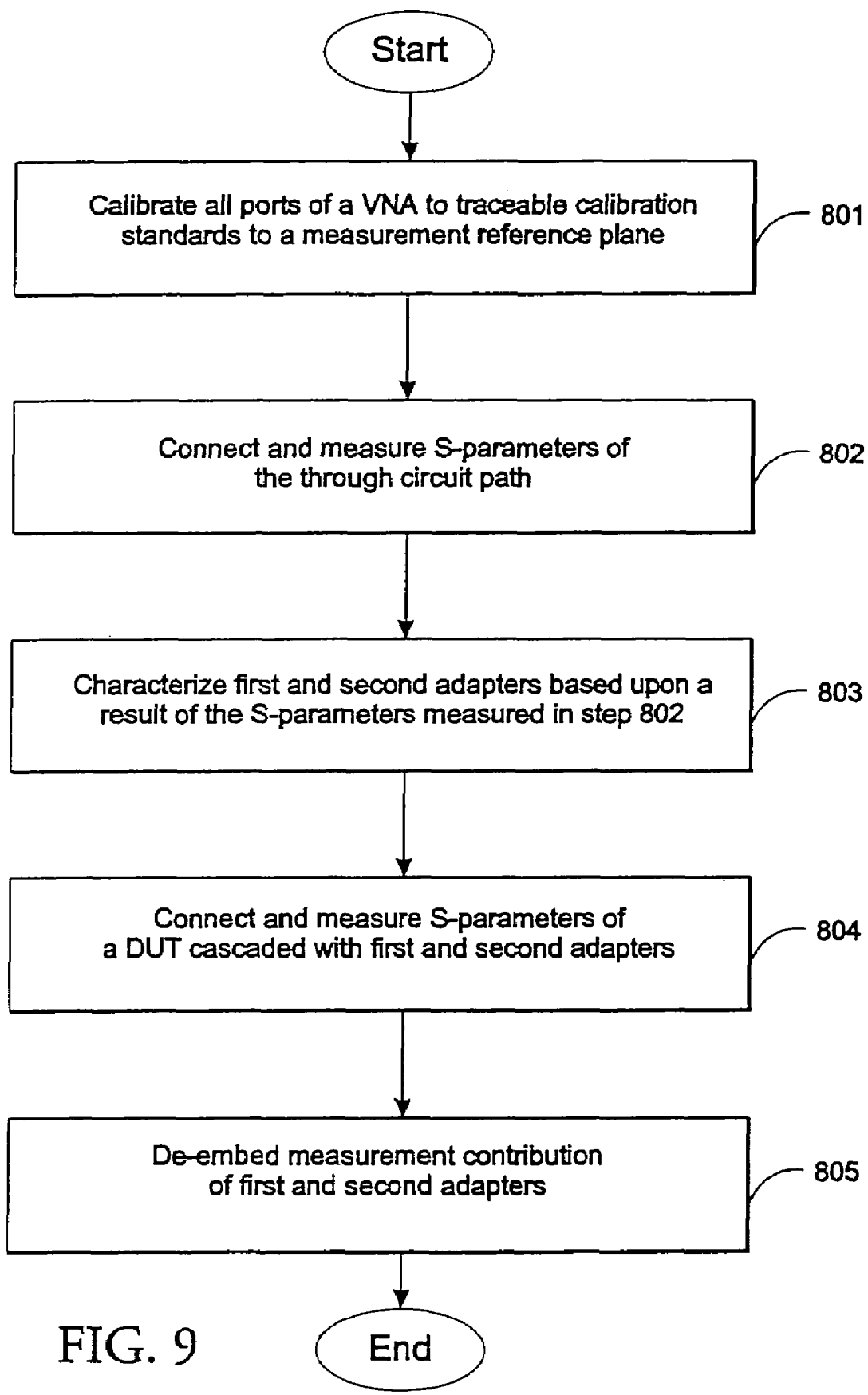
FIGS. 9 and 10 are flowcharts illustrating an embodiment of a method according to the teachings of the present invention.

With specific reference to FIG. 9 of the drawings, there is shown an embodiment of a process according to the teachings of the present invention in which a user calibrates 801 the VNA 200 using calibration standards traceable to NIST. The result of the calibration step 801 is calibration of the VNA 200 and cables 204 at the reference plane 203 delineated by the coaxial ports 201, 202. A user then connects 802 the coaxial ports 201, 202 to the coaxial connectors 120 of the through circuit path 102 on the fixture 100 as shown in FIG. 4 of the drawings and measures the S-parameters of the through circuit path 102. From a measurement of the through circuit path 102, the first and second adapters 106, 108 are characterized 803 by calculating the S-parameter matrix as previously disclosed herein for each adapter 106, 108. Accordingly, the S-parameters of the first and second adapters 106, 108 are known. The DUT is then connected to the first and second adapters 106, 108 of the fixture 100. The S-parameters of the first and second adapters 106, 108 cascaded with the DUT are measured 804 with the VNA 200. When the S-parameters of the cascaded combination, i.e. the first adapter 106, DUT, and second adapter 108, are known via direct measurement, because the S-parameters of the first and second adapters 106, 108 are fully characterized, then the S-parameters of just the DUT are de-embedded 805 using the teachings of U.S. patent application Ser. No. 10/098,040 entitled "Method, Apparatus, and Article of Manufacture for Characterizing a Device and Predicting Electrical Behavior of the Device in a Circuit". The result of the calibration, measurement, characterization, measurement and de-embedding steps is a measurement of the non-coaxial DUT with an accuracy heretofore only available with coaxial DUTs.

Figure 10:
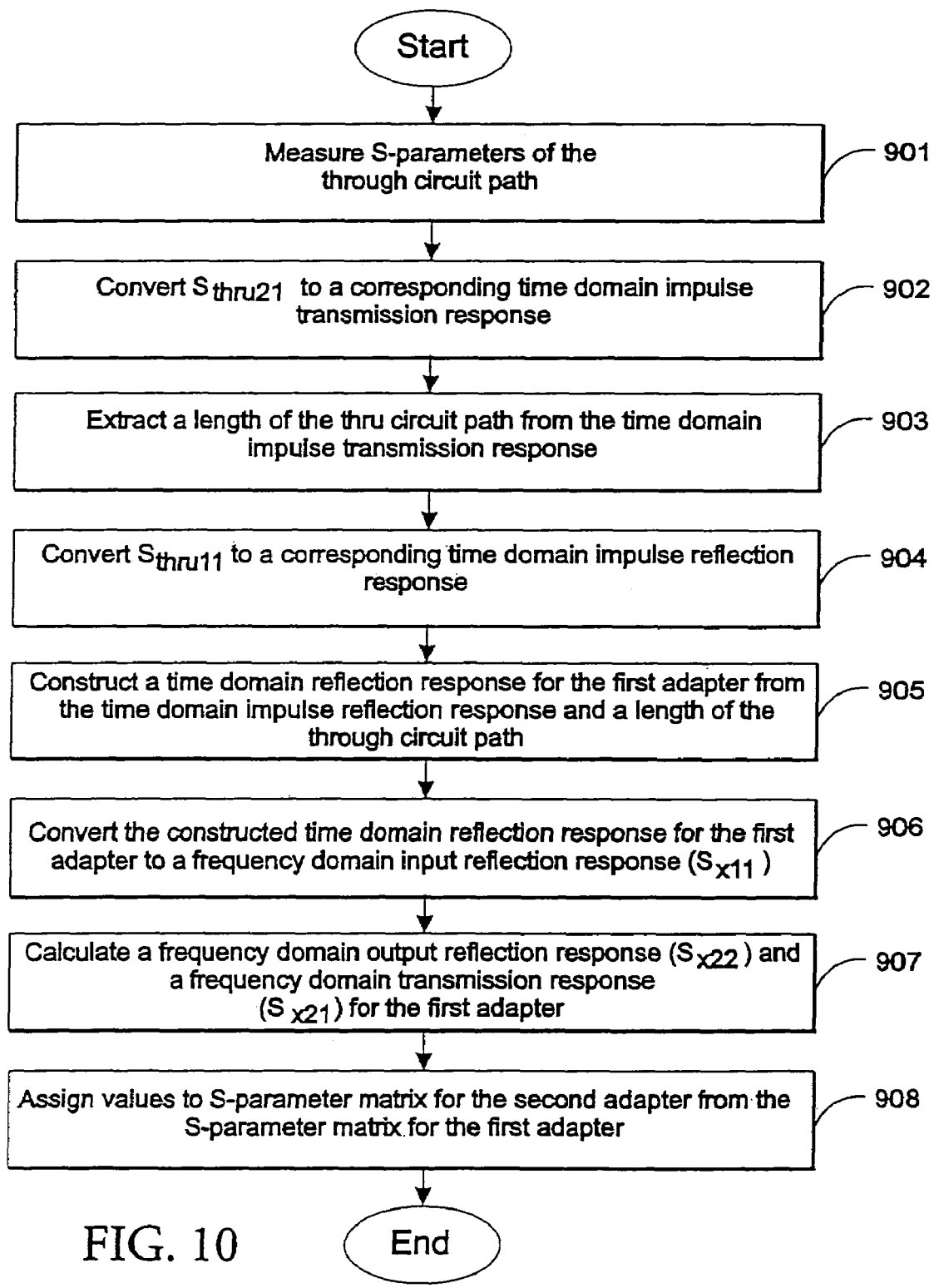

With specific reference to FIG. 10 of the drawings, there is shown a flow chart of the characterization process according to the teachings of the present invention in which the S-parameters of the through circuit path 102 are measured 901. The S-parameter measurement provides the frequency domain transmission coefficient of the through circuit path 102 ($S_{thru21}$) and the frequency domain reflection coefficient of the through circuit path 102 ($S_{thru11}$). The frequency domain transmission coefficient of the through circuit path 102 ($S_{thru21}$) is converted 902 to the corresponding time domain impulse transmission response. This conversion is performed mathematically using the algorithm disclosed in the "Chirp z-transformation Algorithm", Infra, for example and yields a graph such as the one in FIG. 6 of the drawings. The point on the graph at which the impulse response is at a maximum indicates the electrical length of the through circuit path 102. This electrical length is extracted 903 and recorded. The frequency domain input reflection coefficient of the through circuit path 102 ($S_{thru11}$) is converted 904 to the corresponding time domain impulse input reflection response such as the one shown in FIG. 7 of the drawings. A time domain impulse reflection response of the first adapter 106 terminated in a perfect load is constructed 905 from the converted time domain impulse reflection response of the through circuit path 102 by setting the time domain impulse reflection response to a null for electrical lengths longer than the electrical length extracted in step 903. An example of the resulting time domain impulse reflection response is shown in FIG. 8 of the drawings. The constructed time domain impulse reflection response is then converted back into the frequency domain 906. This conversion yields a frequency domain input reflection coefficient for the first adapter 106 ($S_{X11}$). Using equations (1) and (2), the frequency domain output reflection coefficient ($S_{X22}$) and the frequency domain transmission coefficient ($S_{X21}$) are calculated 907 using the measured S-parameters of the through circuit path 102 and the constructed frequency domain input reflection coefficient of the first adapter 106. Because the first adapter 106 is passive, then the frequency domain transmission coefficients are the same, meaning that $S_{X21}=S_{X12}$. Because the first and second adapters 106, 108 have substantially similar S-parameters, but are cascaded with the DUT in mirror image to each other, the S-parameters of the second adapter 108 may be assigned 908 as shown in equation (3).

Figure 11:
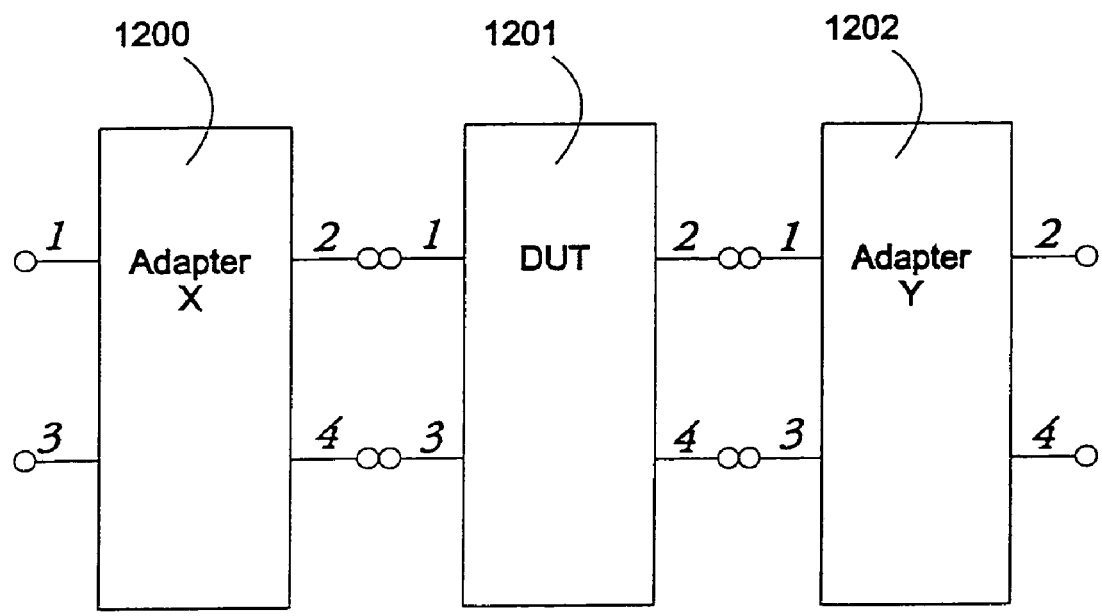
FIG. 11 is an illustration of two 4-port adapters connected to a 4-port DUT and illustrating the port numbering convention used to develop relevant equations according to the teachings of the present invention.

The characterization process may also be performed for N-port fixtures for use in the measurement of N-port devices. The general N-port fixture comprises first and second N-port adapters for connecting to ports of an N-port DUT that may be characterized and then used in the embedding and de-embedding processes. As an example and with specific reference to FIG. 11 of the drawings, there is shown an illustrative diagram of a four-port embodiment where first four-port adapter 1200, Adapter X, four-port DUT 1201, and second four-port adapter 1202, Adapter Y, are connected in cascaded combination with each other. Port numbers 1 through 4 are located at each port of the first and second adapters 1200, 1202 as well as the DUT 1201. The port numbers reflect the numbering conventions used in the S-parameter matrices of the equations developed herein and are consistent with the port numbers for the adapters of FIGS. 12 and 13. With specific reference to FIG. 12 of the drawings, there is shown a first four-port adapter 1001 comprising first and second coaxial connectors 1002, 1003, each coaxial connector 1002, 1003 electrically connected to first and second conductor strips 1005, 1006. Each coaxial connector 1002 or 1003 and conductor strip 1005 or 1006 combination is substantially similar to the first two-port adapter 106 described with reference to FIG. 2 of the drawings. The coaxial connector 1002 or 1003 and conductor strips 1005 or 1006 are uncoupled and isolated from each other. If the first four-port adapter 1001 is represented as Adapter X and according to the port numbering convention shown in the drawing, the S-parameter matrix of the first four-port adapter 1001 may be represented as:

$$\begin{bmatrix} S_{X11} & S_{X12} & 0 & 0 \\ S_{X21} & S_{X22} & 0 & 0 \\ 0 & 0 & S_{X33} & S_{X34} \\ 0 & 0 & S_{X43} & S_{X44} \end{bmatrix} \quad (4a)$$

where the subscripts (1) and (3) represent the two input ports of the first four-port adapter 1001, i.e. an end with the coaxial connectors 1002, 1003, and the subscripts (2) and (4) represent the two output ports of the first four-port adapter 1001, i.e. an end of the conductor strips 1005, 1006. The upper left quadrant of the S-parameter matrix in (4a) of the first four-port adapter 1001 represents the S-parameters of the first coaxial connector 1002 and conductor strip 1005 combination. The lower right quadrant of the S-parameter matrix of the first four-port adapter 1001 represents the S-parameters of the second coaxial connector 1003 and conductor strip 1006 combination. As one of ordinary skill in the art can appreciate, the first coaxial connector 1002 and conductor strip 1005 combination is substantially equivalent electrically and mechanically with the second coaxial connection 1003 and conductor strip 1006 combination. Therefore, the first coaxial connector 1002 and conductor strip 1005 combination has equivalent S-parameters as the second coaxial connector 1003 and conductor strip 1006 combination. Accordingly, the upper left and lower right quadrants of the S-parameter matrix for the first four-port adapter 1001 have equivalent values. Because the first coaxial connector 1002 and conductor strip 1005 combination are isolated from the second coaxial connector 1003 and conductor strip 1006 combination, the upper right and lower left quadrants of the first four-port adapter S-parameter matrix are null values. Therefore, when the S-parameter matrix is determined for the first connector 1002 and conductor strip 1005 combination, the S-parameter matrix for the first four-port adapter 1001 is known.

A second four-port adapter 1007 comprises third and fourth coaxial connectors 1008, 1009, each coaxial connector 1008, 1009 is electrically connected to third and fourth conductor strips 1010, 1011. Each coaxial connector 1008 or 1009 and conductor strip 1010 or 1011 combination is substantially similar to the second two-port adapter 108 previously described. In the specific embodiment illustrated in FIG. 12 of the drawings, the third and fourth coaxial connector 1008 or 1009 and conductor strip 1010 or 1011 combination is substantially similar to the first and second coaxial connector 1002 or 1003 and conductor strip 1005 or 1006 combination. As in the two-port example discussed infra, the first four-port adapter 1001 is connected in mirror image to the second four-port adapter 1007, and the third and fourth coaxial connector 1008 or 1009 and conductor strip 1010 or 1011 combinations are uncoupled and isolated from each other. The port numbering convention for the first adapter 1001 is different from the port numbering convention of the second adapter 1007 as illustrated by the port numbers shown in FIG. 12 of the drawings. Specifically, ports 1 and 3 are assigned to the coaxial connectors 1002, 1003, respectively of the first adapter 1001 and ports 1 and 3 are assigned to the ends of conductor strips 1010, 1011, respectively, of the second adapter 1007. The S-parameter values for both the first and second adapters 1001, 1007 are calculated from measurements made on the through circuit 102 and are based upon the first adapter port numbering convention. In order to accommodate the different physical orientation of the second four-port adapter and because both the first and second adapters 1001, 1007 are passive, the subscripts are modified when using equations (1) through (3) for determination of the S-parameters for the second adapter 1007. Specifically, what is represented as subscripts 1 and 3 of the first adapter 1001 become subscripts 2 and 4, respectively, of the second adapter 1007 and what is represented as subscripts 2 and 4 of the first adapter 1001 are subscripts 1 and 3, respectively, of the second adapter 1007. If the second four-port adapter 1007 is represented as Adapter Y and according to the port numbering convention shown in the drawing, the S-parameter matrix of the second four-port adapter 1007 may, therefore, be represented as:

$$\begin{bmatrix} S_{Y22} & S_{Y21} & 0 & 0 \\ S_{Y12} & S_{Y11} & 0 & 0 \\ 0 & 0 & S_{Y44} & S_{Y43} \\ 0 & 0 & S_{Y34} & S_{Y33} \end{bmatrix} \quad (4b)$$

where the subscripts (2) and (4) represent the two input ports of the second four-port adapter 1007, i.e. an end with the coaxial connectors 1008, 1009, and the subscripts (1) and (3) represent the two output ports of the second four-port adapter 1007, i.e. an end of the conductor strips 1010, 1011. The upper left quadrant of the S-parameter matrix in (4b) for the second adapter 1007 represents the S-parameters of the third coaxial connector 1008 and conductor strip 1010 combination. The lower right quadrant of the S-parameter matrix in (4b) for the second adapter 1007 represents the S-parameters of the fourth coaxial connector 1009 and conductor strip 1011 combination. As one of ordinary skill in the art can appreciate, the third and fourth coaxial connectors 1008, 1009 and conductor strip 1010, 1011 combinations have equivalent S-parameters to each other. Therefore the upper left and lower right quadrants of the S-parameter matrix for the second four-port adapter 1007 have equivalent values. Because the third and fourth coaxial connector 1008, 1009 and conductor strip 1010, 1011 combinations are isolated from each other, the upper right and lower left quadrants of the S-parameter matrix for the second adapter 1007 are null values.

Figure 12:
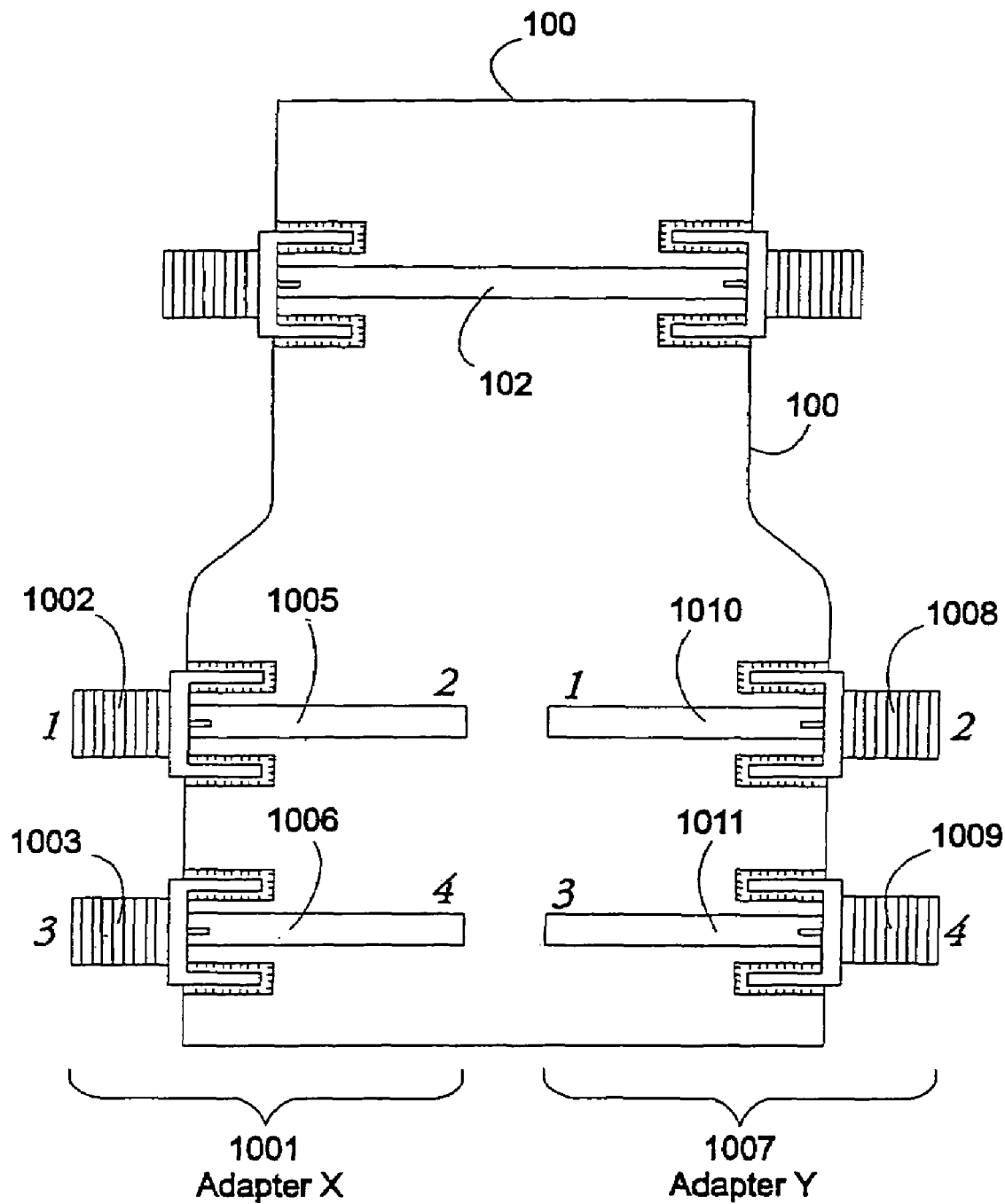
FIGS. 12 and 13 are illustrations of fixtures for use with alternate embodiments of a method and system according to the teachings of the present invention as adapted for multi-port devices.

With specific reference to FIG. 12 of the drawings, the fixture embodiment is shown where first, second, third, and fourth coaxial connectors 1002, 1003, 1008, 1009, respectively, in combination with first, second, third and fourth conductor strips 1005, 1006, 1010, 1011, respectively, are substantially similar both electrically and mechanically. Accordingly, each coaxial connector 1002, 1003, 1008, 1009 in combination with first, second, third, and fourth conductor strips 1005, 1006, 1010, 1011, have substantially similar S-parameter values. The first and second four-port adapters 1001, 1007 are positioned in the fixture in mirror image to each other. Accordingly, if the character Y represents the second four-port adapter 1007, then the S-parameter matrix for the second four-port adapter 1007 in terms of the first adapter terms is:

$$[S_Y] = \begin{bmatrix} S_{X22} & S_{X21} & 0 & 0 \\ S_{X12} & S_{X11} & 0 & 0 \\ 0 & 0 & S_{X44} & S_{X43} \\ 0 & 0 & S_{X34} & S_{X33} \end{bmatrix} \quad (5)$$

Using the teachings of the two-port characterization method described herein, the first coaxial connector 1002 and conductor strip 1005 combination is characterized by first calibrating the coaxial connections to the fixture 100 with a four port VNA and then measuring the S-parameters of the through circuit path 102. As one of ordinary skill in the art appreciates, any measurement using a four-port VNA must properly terminate unused measurement ports with a characteristic impedance termination. Performing steps 901 through 908, it is possible to fully characterize the first four-port adapter 1001. Using the principles of symmetry for the embodiment shown in FIG. 12 of the drawings, the characterization of the first four-port adapter 1001 yields appropriate values to fully characterize the second four-port adapter 1007 according to equation (5). Accordingly, the process illustrated in FIG. 10 of the drawings is applied to the four-port adapter embodiment where characterization of the first coaxial connector 1002 and conductor strip 1005 combination permits complete characterization of first and second four-port adapters 1001, 1007, where first, second, third and fourth coaxial connector 1002, 1003, 1008, 1009, respectively, and conductor strip combinations 1005, 1006, 1010, 1011, respectively, are electrically and mechanically equivalent. Using the teachings of the U.S. patent application Ser. No. 10/098,040, the S-parameters of just the measured DUT are de-embedded from a measurement of the cascaded combination of the first and second adapters 1001, 1007 and the DUT.

Figure 13:
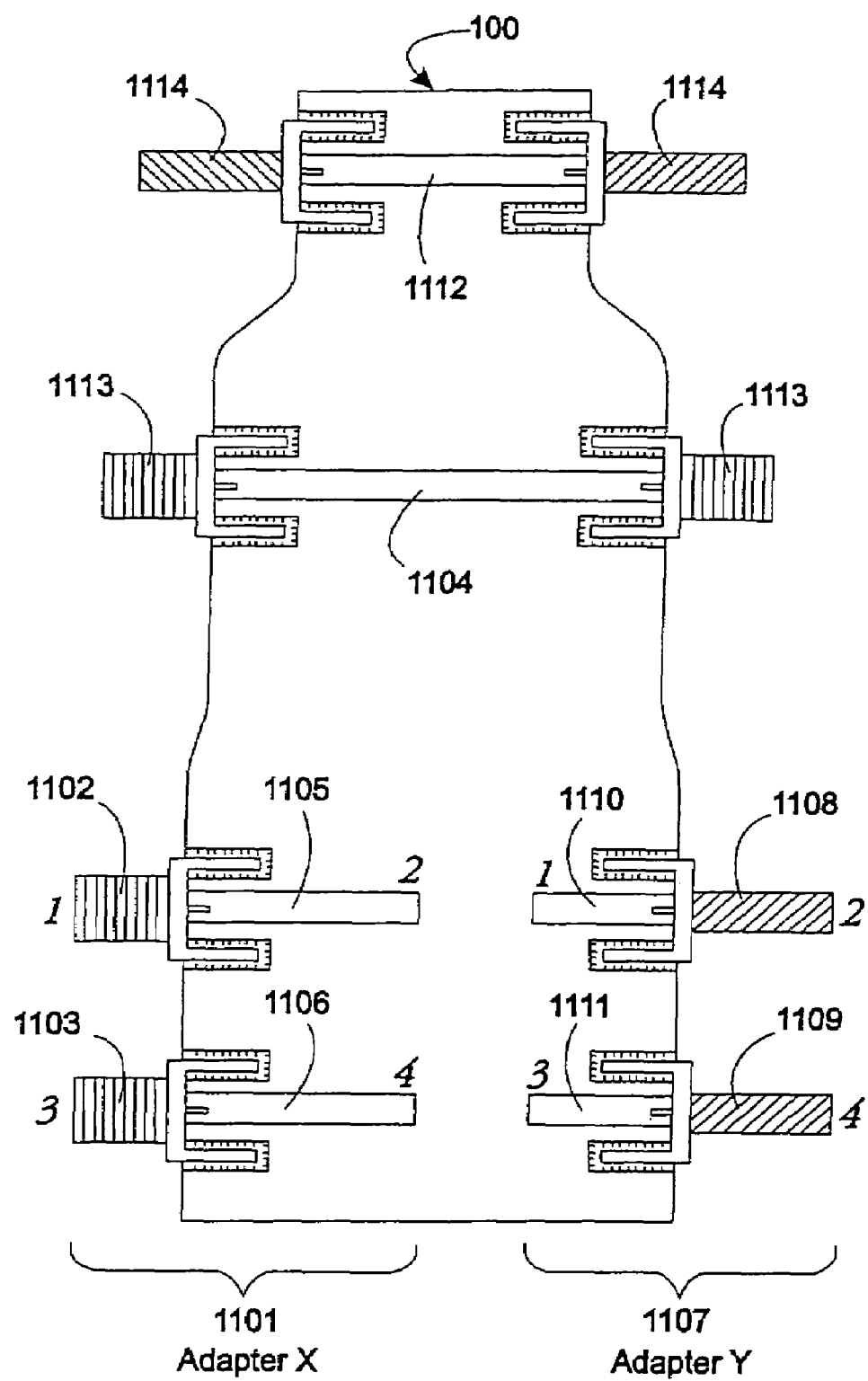

The teachings of the present invention may also be applied to an N-port adapter embodiment where the N-port adapters are not electrically and mechanically equivalent. With specific reference to FIG. 13 of the drawings, there is shown an alternate embodiment of the fixture 100 where the first and second four-port adapters 1101, 1107 are not electrically and mechanically equivalent. In this example, four ports are used for illustrative purposes. However, it is apparent to one of ordinary skill in the art that the teachings may be applied to fixtures and DUTs having more than four ports. In FIG. 13 of the drawings, there is shown a fixture 100 comprising a first four-port adapter 1101, Adapter X. The first four-port adapter 1101 comprises a first coaxial connector 1102 and conductor strip 1105 combination and a second coaxial connector 1103 and conductor strip 1106 combination. The first and second coaxial connectors 1102, 1103 are of a same type, i.e. Type N, and the first and second conductor strips 1105, 1106 have equivalent lengths and are made of the same materials. Accordingly, the first and second coaxial connector 1102, 1103 and conductor strip 1105, 1006 combinations are electrically and mechanically equivalent and it can be assumed that they have the same S-parameters that characterize their high frequency behavior. Also on the fixture 100 is a first through circuit path 1104 in which through circuit coaxial connectors 1113 are of a same type as the first and second coaxial connectors 1102 and 1103. A conductor strip that makes up the first through circuit path 1104 is twice as long as a length of the first and second conductor strips 1105, 1006.

The second four-port adapter 1107, Adapter Y, comprises a third coaxial connector 1108 and conductor strip 1110 combination and a fourth coaxial connector 1109 and conductor strip 1111 combination. The third and fourth coaxial connectors 1108, 1109 are of a same type, but may be of a different type than the first and second coaxial connectors 1102, 1103, i.e. a 7 mm coaxial connector. The third and fourth conductor strips 1110, 1111 have equivalent lengths and are made of the same materials, however, they may have a different length than the first and second conductor strips 1105, 1106. The third and fourth coaxial connector 1108, 1109 and conductor strip 1110, 1111 combinations, therefore, are electrically and mechanically equivalent to each other, but not electrically and mechanically equivalent to the first and second coaxial connector 1102, 1103 and conductor strip 1105, 1106 combinations. Accordingly, it can be assumed that the third and fourth coaxial connector 1108, 1109 and conductor strip combinations 1110, 1111 have the same S-parameters as each other that characterize their high frequency behavior, and different S-parameters than the first and second coaxial connector 1102, 1103 and conductor strip 1105, 1106 combinations. The fixture 100 also includes a second through circuit path 1112 in which through circuit coaxial connectors 1114 are of a same type as the third and fourth coaxial connectors 1108 and 1109 and of a different type as the first and second coaxial connectors 1102, 1103. A conductor strip that makes up the second through circuit path 1112 is twice as long as a length of the third and fourth conductor strips 1110, 1111.

Full characterization of the first and second four-port adapters illustrated in FIG. 13 of the drawings begins with the conventional calibration of the four-port VNA and adapter cables that connect to the fixture 100. Characterization of the first four-port adapter 1101, designated as adapter X, begins with a VNA measurement 901 of the first through circuit path 1104, conversion 902 of the frequency domain transmission coefficient to a time domain impulse response to extract 903 a length of the first through circuit path 1104. Steps 904 through 907 as illustrated in FIG. 10 of the drawings and described infra as applied to the first through circuit path 1104 result in determination of the S-parameters of the first coaxial connector 1102 and conductor strip combination 1105. Because the first and second coaxial connector 1102, 1103 and first and second conductor strip 1105, 1106 combinations are electrically and mechanically equivalent, then their S-parameters are also equivalent. Because the first and second coaxial connector 1102, 1103 and conductor strip 1105, 1106 combinations are disposed in the fixture in the same direction, they share the same two-port S-parameter matrix. Accordingly, full characterization of the first four-port adapter 1101 is:

$$\begin{bmatrix} S_{X11} & S_{X12} & 0 & 0 \\ S_{X21} & S_{X22} & 0 & 0 \\ 0 & 0 & S_{X11} & S_{X12} \\ 0 & 0 & S_{X21} & S_{X22} \end{bmatrix} \quad (6)$$

where the subscript (1) refers to a coaxial connector 1102 end of the first adapter 1101 and the subscript (2) refers to a conductor strip 1105 end of the first adapter 1101.

Characterization of the second four-port adapter in the embodiment illustrated in FIG. 13 of the drawings cannot use the principle of symmetry to extract values from the first four-port adapter 1101 measurements because the first four-port adapter 1101 is not electrically and mechanically equivalent to the second four-port adapter 1107. To characterize the second four-port adapter 1107, designated as adapter Y, according to the method disclosed in FIG. 10 of the drawings, a measurement 901 is made of the second through circuit path 1112. The second through circuit path 1112 comprises coaxial connectors 1114 that are of a same type as the third and fourth coaxial connectors 1108, 1109. Additionally, the second through circuit path 1112 has a length of conductor strip that is twice the length of the third and fourth conductor strips 1110, 1111. The frequency domain transmission coefficient of the second through circuit path 1112 is converted 902 to a time domain impulse response to extract 903 an electrical length of the second through circuit path 1104. Steps 904 through 907 as illustrated in FIG. 10 of the drawings and described infra result in determination of the S-parameters of the third coaxial connector 1108 and conductor strip combination 1110. Because the third and fourth coaxial connector 1108, 1109 and third and fourth conductor strip 1110, 1111 combinations are electrically and mechanically equivalent, then their S-parameters are also equivalent. Because the third and fourth coaxial connector 1108, 1109 and conductor strip 1110, 1111 combinations are disposed in the fixture in the same direction, they also share the same S-parameter matrix. They are not, however, disposed in the fixture 100 in the same direction as the second through circuit path 1112 from which their S-parameters are determined. Because the adapters are passive and symmetrical and positioned in the fixture in mirror image to the adapter as calculated from the second through circuit 1112, however, the second four-port adapter 1107 may nonetheless be fully characterized by switching the input reflection term and the output reflection terms as well as the two transmission terms. Accordingly, full characterization of the second four-port adapter 1107 is:

$$\begin{bmatrix} S_{Y22} & S_{Y21} & 0 & 0 \\ S_{Y12} & S_{Y11} & 0 & 0 \\ 0 & 0 & S_{Y22} & S_{Y21} \\ 0 & 0 & S_{Y12} & S_{Y11} \end{bmatrix} \quad (7)$$

where the subscript (2) refers to a coaxial connector 1108 end of the second adapter 1107 and the subscript (1) refers to a conductor strip 1110 end of the second adapter 1107. Once both the first and second four-port adapters 1101, 1107 are fully characterized, the teachings of U.S. patent application Ser. No. 10/098,040 may be used to embed and de-embed characteristics of a four-port DUT from a measurement of the DUT cascaded with the first and second four-port adapters 1101, 1107. Advantageously, an embodiment of the present invention according to the description as illustrated in FIG. 13 of the drawings, permits full characterization of a non-symmetrical N-port adapter.

Embodiments of the invention are described herein by way of example and are intended to be illustrative and not exclusive of all possible embodiments that will occur one of ordinary skill in the art with benefit of the present teachings. Specifically, the teachings may be applied to any N-port DUT. The method may be implemented in software using a personal computer, a workstation, or a dedicated microprocessor in combination with a VNA. The system and method of the present teachings may be used to characterize on-wafer and on-board standards that may in turn be used for standards based calibrations. The teachings may be used for 50 ohm, 75 ohm, or any other impedance value for use with calibration standards. Possible coaxial connections that may be used on the fixture are 2.4 mm, 3.5 mm, 7.0 mm, type-N, type-F or any other connector with standards traceable to NIST.

The invention claimed is:

1. A system for calibrating a measurement device path comprising:
   a vector network analyzer (VNA),
   calibration standards,
   means for calibrating ports of the VNA with said calibration standards,
   a fixture comprising a symmetrical through circuit path and a measurement device path, said through circuit path comprising a cascaded combination of first and second adapters, said first adapter being passive and substantially identical to said second adapter, said measurement device path comprising uncascaded first and second adapters, wherein said through circuit path and said measurement device path have substantially equivalent S-parameters,
   means in said VNA for measuring frequency domain responses of said through circuit path, and
   means for characterizing said first and second adapters based upon said S-parameters of said through circuit path.

2. A system for calibrating as recited in claim 1 wherein said means for characterizing said first and second adapters comprises means for converting said frequency domain coefficients to corresponding time domain impulse responses to solve for S-parameters of said first and second adapters in said measurement device path.

3. A system for calibrating as recited in claim 2, wherein said frequency domain responses include a frequency domain transmission response and a frequency domain input reflection response, the system further comprising:
   means for converting said frequency domain transmission coefficient to a corresponding time domain impulse transmission response,
   means for extracting a length of said through circuit path from said time domain impulse transmission response,
   means for converting said frequency domain input reflection coefficient to a corresponding time domain impulse input reflection response,
   means for constructing a time domain impulse input reflection response for said first adapter,
   means for converting said time domain impulse input reflection response for said first adapter to a corresponding frequency domain input reflection coefficient for said first adapter,
   means for calculating S-parameters for said first adapter, and
   means for assigning S-parameters for said second adapter.

4. A system for calibrating as recited in claim 3 wherein said means for constructing said time domain impulse input reflection response for said first adapter comprises means for converting said frequency domain input reflection coefficient using a full time sweep and means zeroing a portion of said time domain impulse input reflection response beginning at a point that represents half said length of said through circuit path.

5. A system for calibrating as recited in claim 3 wherein said means for constructing said time domain impulse input reflection response for said first adapter comprises means for converting said frequency domain input reflection coefficient using a limited time sweep wherein said time domain boundary is equal to said length of the through circuit path.

6. A system for calibrating as recited in claim 3 wherein said means for calculating said S-parameters for said first adapter uses said frequency domain coefficients of said through circuit path ($S_{thru11}$ and $S_{thru21}$) and said frequency domain input reflection coefficient for said first adapter ($S_{X11}$) in equation:

$$S_{X22} = \frac{S_{thru11} - S_{X11}}{S_{thru12}} \text{ and } S_{X21} = \sqrt{S_{thru12} - \frac{(S_{X11} - S_{thru11})^2}{S_{thru12}}}.$$

7. A system for calibrating as recited in claim 6 wherein said means for assigning said S-parameters for said second adapter further comprises means for assigning said frequency domain transmission coefficient of said first adapter to a frequency domain transmission coefficient of said second adapter ($S_{X12}=S_{X21}=S_{\overline{X}12}=S_{\overline{X}21}$), means for assigning said frequency domain input reflection coefficient of said first adapter ($S_{X11}$) to a frequency domain output reflection coefficient of said second adapter ($S_{\overline{X}11}$), and means for assigning said frequency domain output reflection coefficient of said first adapter ($S_{X22}$) to a frequency domain input reflection coefficient of said second adapter ($S_{\overline{X}22}$).

8. A system for calibrating as recited in claim 1 wherein said through circuit path comprises a cascaded embodiment of said device measurement path.

9. A system for calibrating as recited in claim 8 wherein said fixture comprises a printed circuit board with a printed circuit trace interconnected to two connectors for establishing a reliable connection with impedance standards traceable to a reference standard.

10. A system for calibrating as recited in claim 1 wherein said first and second adapters are two ports that comprise a first multi-port adapter.

11. A system for measuring a device comprising:
    a vector network analyzer (VNA),
    calibration standards,
    means for calibrating coaxial ports of said vector network analyzer using said calibration standards,
    a fixture, comprising a symmetrical through circuit path between said coaxial ports, said through circuit path comprising a cascaded combination of first and second adapters, said first adapter being passive and substantially identical to said second adapter, wherein said uncascaded first and second adapters comprise a measurement device path, wherein said through circuit path and said measurement device path have substantially equivalent S-parameters,
    means for characterizing said first and second adapters based upon measured S-parameters of said through circuit path, and
    means for de-embedding said first and second adapters from said measurement device path.

* * * * *